(12) United States Patent
Lapadatu et al.

(10) Patent No.: US 8,999,813 B2
(45) Date of Patent: Apr. 7, 2015

(54) FOCAL PLANE ARRAY AND METHOD FOR MANUFACTURING THE SAME

(75) Inventors: Adriana Lapadatu, Horten (NO); Gjermund Kittilsland, Horten (NO)

(73) Assignee: SensoNor AS (NO)

( * ) Notice: Subject to any disclaimer, the term of this patent is extended or adjusted under 35 U.S.C. 154(b) by 95 days.

(21) Appl. No.: 13/582,120

(22) PCT Filed: Mar. 1, 2011

(86) PCT No.: PCT/EP2011/053050
§ 371 (c)(1),
(2), (4) Date: Oct. 4, 2012

(87) PCT Pub. No.: WO2011/107487
PCT Pub. Date: Sep. 9, 2011

(65) Prior Publication Data
US 2013/0026592 A1   Jan. 31, 2013

(30) Foreign Application Priority Data
Mar. 2, 2010   (EP) .................................... 10155249

(51) Int. Cl.
*H01L 21/30* (2006.01)
*H01L 27/146* (2006.01)

(52) U.S. Cl.
CPC ...... *H01L 27/1467* (2013.01); *H01L 27/14634* (2013.01); *H01L 27/1469* (2013.01)

(58) Field of Classification Search
USPC ................ 438/72, 126, 112, 455; 257/E21.6, 257/E21.602
See application file for complete search history.

(56) References Cited

U.S. PATENT DOCUMENTS

| 6,144,030 A | 11/2000 | Ray et al. |
| 2010/0079631 A1* | 4/2010 | Mitra ............................ 348/294 |

FOREIGN PATENT DOCUMENTS

| EP | 0 773 436 A2 | 5/1997 |
| GB | 2 411 521 A | 8/2005 |

(Continued)

OTHER PUBLICATIONS

Ruzmetov et al., "Infrared reflectance and photoemission spectroscopy studies across the phase transition boundary in thin film vanadium dioxide," J. Phys. Condens. Matter. 20 (2008), 465204.*

(Continued)

*Primary Examiner* — Julia Slutsker
(74) *Attorney, Agent, or Firm* — Hovey Williams LLP

(57) ABSTRACT

A method of forming a focal plane array by: forming a first wafer having sensing material provided on a surface, which is covered by a sacrificial layer, the sensing material being a thermistor material defining at least one pixel; providing supporting legs for the pixel within the sacrificial layer, covering them with a further sacrificial layer and forming first conductive portions in the surface of the sacrificial layer that are in contact with the supporting legs; forming a second wafer having read-out integrated circuit (ROIC), the second wafer being covered by another sacrificial layer, into which is formed second conductive portions in contact with the ROIC; bringing the sacrificial oxide layers of the first wafer and second wafer together such that the first and second conductive portions are aligned and bonding them together such that the sensing material is transferred from the first wafer to the second wafer when a sacrificial bulk layer of the first wafer is removed; and removing the sacrificial layers to release the pixel, with the supporting legs underneath it.

20 Claims, 8 Drawing Sheets

(56) References Cited

FOREIGN PATENT DOCUMENTS

WO          01/09948 A1    2/2001
WO          01/54189 A1    7/2001

OTHER PUBLICATIONS

Kats et al, "Ultra-thin perfect absorber employing a tunable phase change material," Appl. Phys. Lett. 101, 221101, (2012).*

Niklaus F et al: "MEMS-based uncooled infrared bolometer arrays: a review", Proceedings of the SPIE—The International Society for Optical Engineering SPIE—The International Society for Optical Engineering USA LNKD—vol. 6836, Nov. 29, 2007, pp. 68360D-1, XP002586083, ISSN: 0277-786X.

* cited by examiner

FOCAL PLANE ARRAY AND METHOD FOR MANUFACTURING THE SAME

The present invention relates to the manufacture of focal plane arrays and, in particular, the manufacture of a focal plane array for use in a thermal imaging device, using transfer bonding of sensing material.

The resolution of an imaging device is very much dependent on the number of pixels provided in its focal plane array. The number of pixels is, in turn, limited by the dimensions of the focal plane array.

In existing focal plane arrays, pixels are generally supported by legs that extend from opposing sides. However, legs arranged in this way occupy valuable space within the focal plane array, which limits the amount of sensing material available and hence limits the performance of the imaging device.

Accordingly, an aim of the present invention is to provide a focal plane array in which the active sensing area is maximised.

According to the present invention there is provided a method of forming a focal plane array comprising one or more pixels, the focal plane array being fabricated by:

forming a first wafer having sensing material provided on a surface, which is covered by a first sacrificial layer, the sensing material defining one or more pixels on the first wafer;

providing support legs for each of the one or more pixels within the first sacrificial layer, covering them with a further sacrificial layer and forming first conductive portions for each of the one or more pixels in the surface of the sacrificial layer that are in contact with the respective support legs;

forming a second wafer having read-out integrated circuit (ROIC), the second wafer being covered by a second sacrificial layer, into which is formed second conductive portions for each of the one or more pixels in contact with the ROIC;

bringing the sacrificial layers of the first wafer and second wafer together such that the first and second conductive portions for each of the one or more pixels are aligned and bonding them together such that the sensing material is transferred from the first wafer to the second wafer when a sacrificial bulk layer of the first wafer is removed; and removing the sacrificial layers to release the at least one pixel, wherein each of the support legs is a single component in direct physical contact with both the pixel and the ROIC to provide an electrical connection therebetween and is arranged to be completely beneath the sensing material of the pixel they are provided for.

The supporting legs are free-standing and act as mechanical support to separate the pixel from the ROIC substrate while ensuring that the active sensing area is maximised, due to the legs being arranged to be completely beneath the sensing material of each pixel in the focal plane array. The legs also provide an electrical connection for each pixel to the ROIC lying beneath the focal plane array.

As the pixel legs do not take up any space to the sides of the pixels, the total area of active sensing material can be maximised in an array when compared to the area available in an array having conventional pixels with legs at their sides. Furthermore, focal plane arrays manufactured according to the method of the present invention are two level-structures, which are realised by use of wafer bonding. In addition to maximising the active sensing area available, the present invention also provides a manufacturing method which enables a plurality of vacuum encapsulated focal plane arrays to be formed simultaneously at wafer level on a single ROIC substrate, which can subsequently be diced to provide individual focal plane arrays.

The wafer-level transfer of the sensing material onto the ROIC allows the utilisation of high performance crystalline materials, which could not previously be used due to the layer-wise construction of the pixels required.

According to the method of the present invention, a high performance focal plane array having peak responsivity in the 7 to 14 µm wavelength region can be achieved. The array resolution is typically in the range of quarter VGA to full VGA, but is not limited to this range. Pixel pitch for this wavelength is typically in the range 13 to 40 µm.

An example of the present invention will now be described with reference to the accompanying figures, in which.

Figure 1:
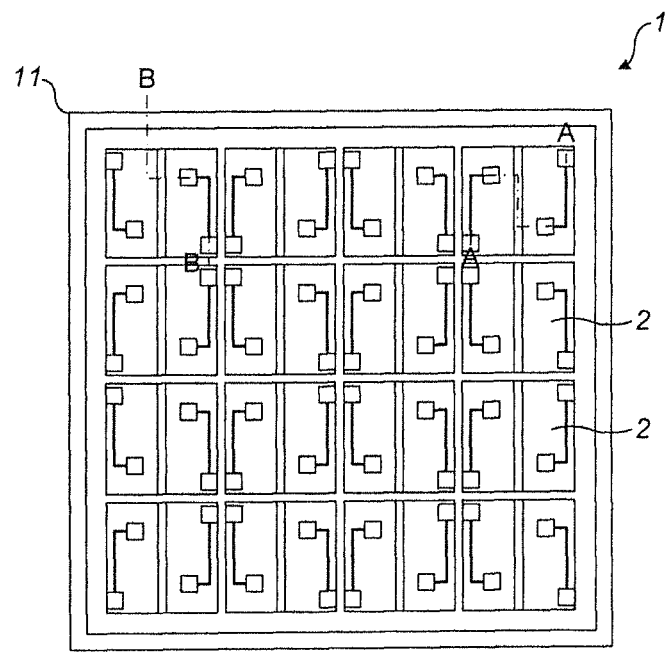
FIG. 1 is a plan view of a focal plane array (FPA) according to an example of the present invention.

FIG. 1 shows a plan view of a focal plane array (FPA) 1, according to the present invention, before sealing, the FPA comprising a plurality of pixels 2 arranged in an array. The focal plane array 1 of this example is suitable for a thermal imaging device and hence each pixel 2 is a bolometer pixel comprising sensing material 3, which in this example consists of a thermistor built as a layer stack of, for example, Si and SiGe with contacting and buffer layers, as will be described in detail below.

The material for the thermistor 3 is chosen on the basis that it has a strong temperature dependent resistivity. Energy absorbed in the layers generates heat, resulting in a measurable change in the thermistor 3 resistance. Absorption of the infra-red (IR) waves is enhanced by the introduction of an absorber layer 4 positioned on an upper surface of the thermistor 3 at a wavelength optimised distance from a reflector layer 5 that is deposited on the reverse side of the thermistor 3, as can be seen in FIG. 2.

Once the FPA 1 has been formed, as will be described below, a cap wafer 10 is sealed, in a vacuum, over the FPA 1 and thus heat transfer from the pixels 2 to the surroundings is low. A bonding frame 11 is provided around the FPA 1 for the cap wafer 10 to be sealed onto.

The pixels 2 arranged around the outer edge of the FPA 1 are thermally-shorted or "blind" reference pixels. In addition, the FPA may also contain temperature sensors and vacuum level sensors. The analogue signals from the pixels 2 are converted to digital format by read-out integrated circuitry (ROIC) provided on a ROIC wafer 9 and this information is used to present an image.

Figure 2:
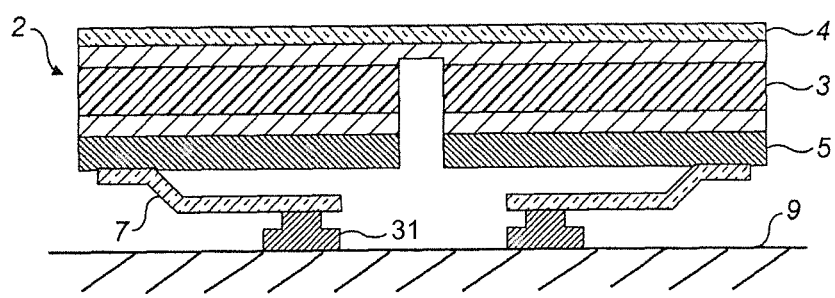
FIG. 2 is a schematic representation of a pixel of the focal plane array of FIG. 1, taken through section A-A.

FIG. 2 shows a schematic representation of a section (A-A) of the FPA in FIG. 1 showing the basic structure of a typical pixel 2 formed by the method of the present invention. In particular it can be seen how each pixel 2 is spaced apart from the ROIC wafer 9 by free-standing supporting legs 7 that are provided underneath the pixel 2. These legs 7 provide the dual function of acting as mechanical supports for the pixel 2, as well as providing an electrical connection between the pixel 2 and the ROIC lying beneath it on the ROIC wafer 9. Both the material and design of the pixel legs 7 are selected to ensure that heat transfer from the pixel 2 to the surroundings is minimised.

Figure 3:
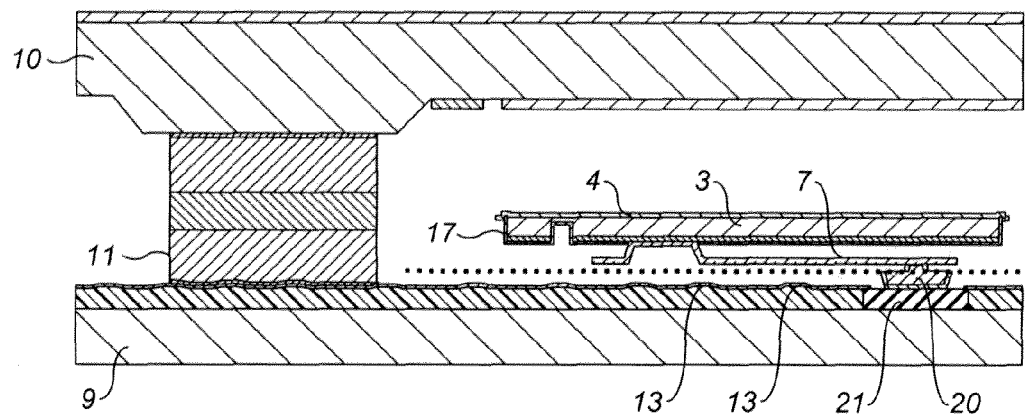
FIG. 3 is a representation of a sectional view through a pixel sealed within the focal plane array of FIG. 1, taken through B-B.
Figure 4A:
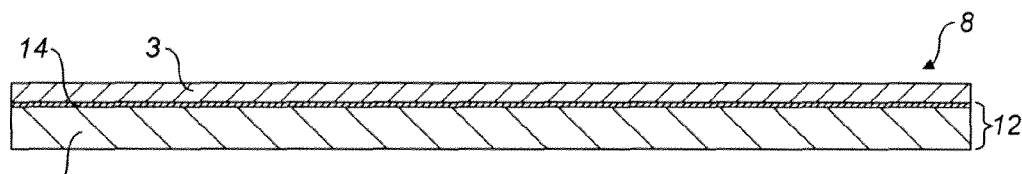
FIG. 4 shows the steps for forming an infra-red (IR) wafer prior to transfer bonding of thermistor material.
Figure 4B:
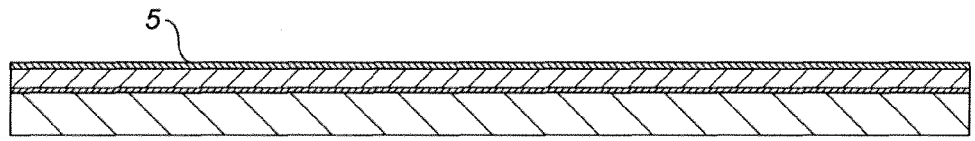
Figure 4C:
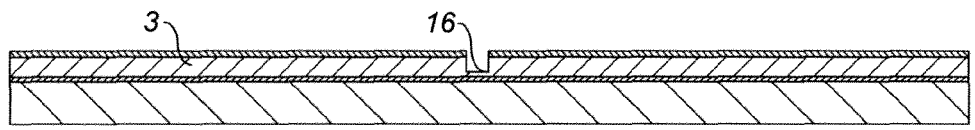
Figure 4D:
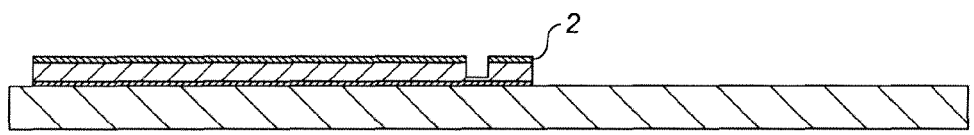
Figure 4E:
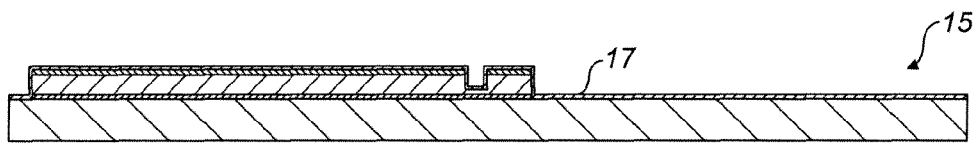
Figure 4F:
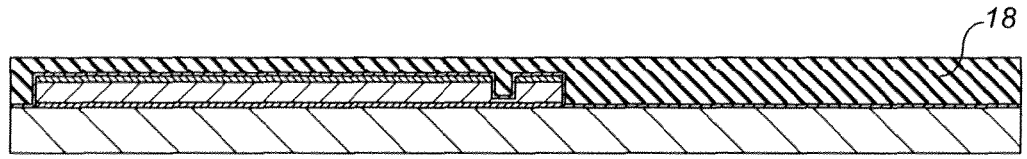
Figure 4G:
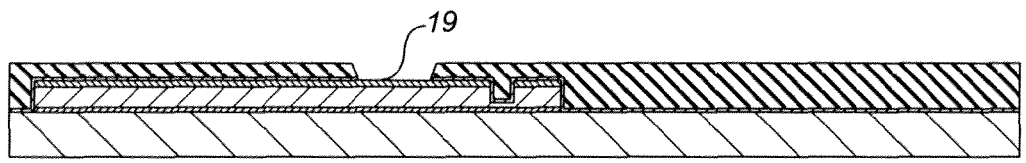
Figure 4H:
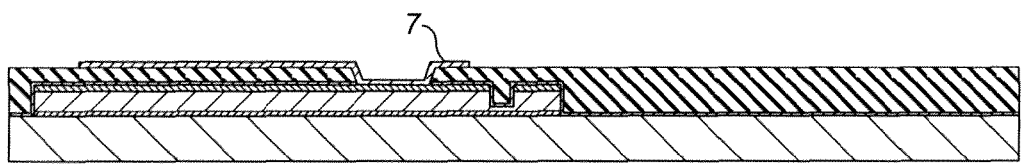
Figure 4I:
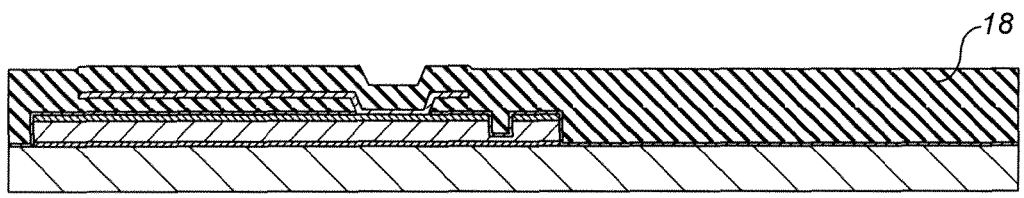
Figure 4J:
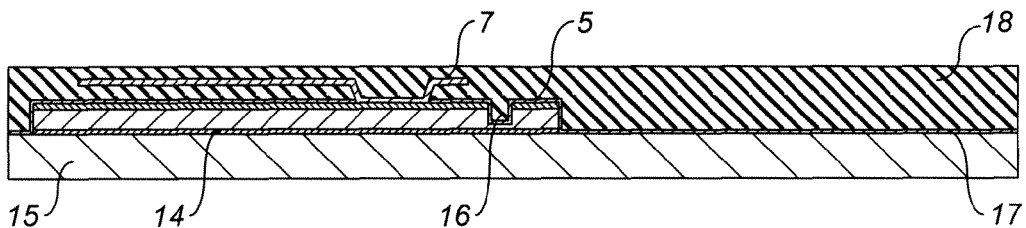
Figure 5A:
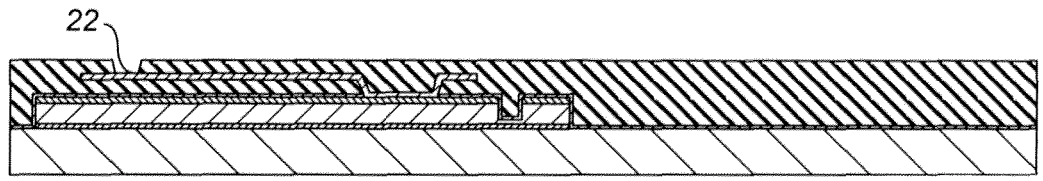
FIG. 5 shows the steps for forming first conductive portions on the infra-red (IR) wafer.
Figure 5B:
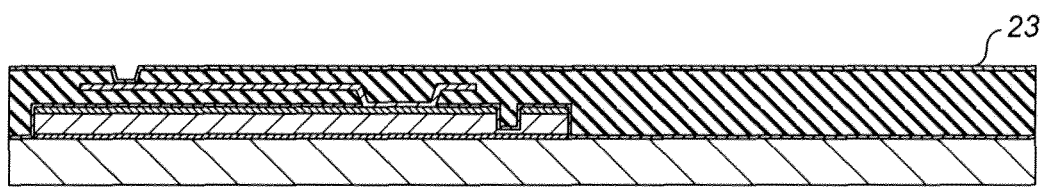
Figure 5C:
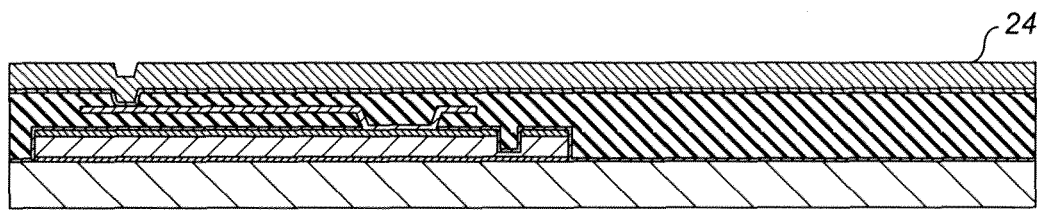
Figure 5D:
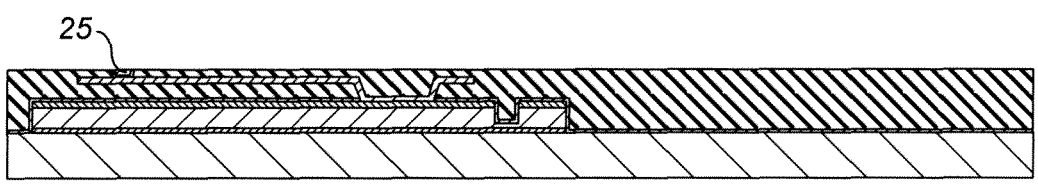
Figure 6A:
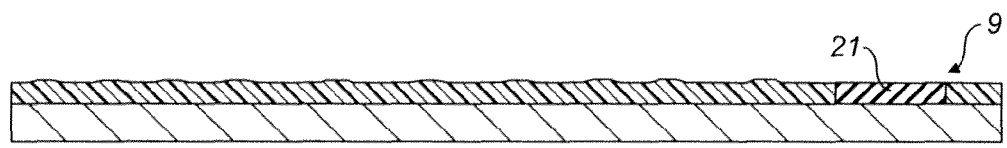
FIG. 6 shows the steps for preparing a pre-fabricated read-out integrated circuit (ROIC) wafer with second conductive portions prior to transfer bonding of thermistor material.
Figure 6B:
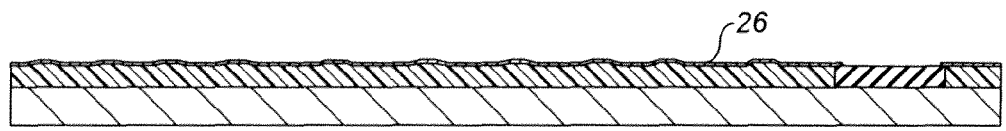
Figure 6C:
Figure 6D:
Figure 6E:
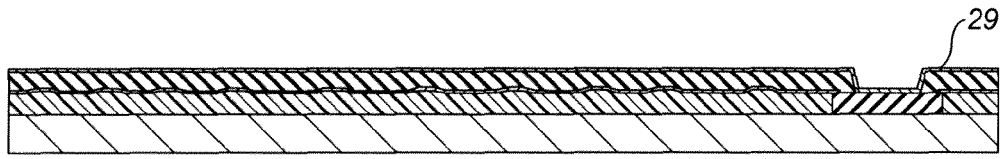
Figure 6F:
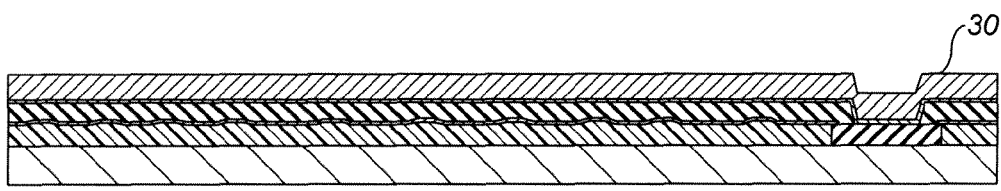
Figure 6G:
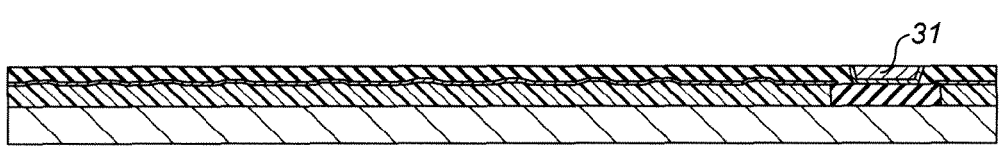

FIG. 3 is a schematic representation of a section (B-B) of the FPA in FIG. 1 showing a resulting pixel 2 formed by the method of the present invention. In all of the following figures, the pixels 2 are represented according to section B-B of FIG. 1, although it should be understood that the pixels 2 are actually defined as two halves, as shown in the representation of FIG. 2. The pixels are mirrored across a trench 16 that is etched into the IR wafer 8, as will be described below.

It can be seen from FIG. 3 that a bonding frame 11 structure for supporting the cap wafer 10 is provided to the side of the pixel 2. The capped FPA 1 starts out as three separate wafers: an ROIC wafer 9, an IR wafer 12 including the thermistor material 3, and a cap wafer 10. The IR wafer 12 and ROIC wafer 9 are joined by transfer bonding of the thermistor material 3 to form the pixels 2, which are then sealed by the cap wafer 10 using a suitable bonding method, such as Cu—Sn bonding, to bond it to the bonding frame 11.

The ROIC wafer 9 is pre-fabricated using standard CMOS processing technology, which is well known and hence not further described here. However, irregularities are shown on the top surface 13 of the ROIC wafer 9 to illustrate a typical top surface topography that might result from standard CMOS processing.

The IR wafer 8, in this example, is created by using a standard silicon-on-insulator (SOI) wafer 12 having a BOX layer 14, and a device layer having a thickness appropriate for being a first, highly doped $p^+$ Si layer in a layer stack that forms the sensing material 3. Of course, any suitable carrier may be used in place of the SOI wafer. The rest of the layers, including the required doping layer, are built by epitaxial growth of single crystalline Si and SiGe to create quantum well layers on top of the un-patterned SOI wafer. These quantum well layers thereby provide an IR sensitive thermistor material 3. Single or multiple quantum well layers may be used depending on performance requirements.

The thermistor material 3 used in the IR wafer 12 is, preferably, based on a material concept described in U.S. Pat. No. 6,292,089 and consists of single crystal Si and SiGe quantum well layers. This thermistor 3 material has a high temperature coefficient of resistance as well as low noise characteristics, and is fully compatible with standard CMOS processes. Highly doped $p^+$ Si layers (around $10^{19}$ cm$^{-3}$) are used on both sides of the quantum well layers structure to provide ohmic contacts to the thermistor 3. Furthermore, an undoped Si barrier layer must exist between the highly doped p+ Si layers and the quantum well layers. SOI wafers and their formation are well known in the art. In this example of the present invention, the total thickness of all layers provided above a BOX layer 14 of the SOI wafer 12 should be wavelength optimised, which for the present invention will be, ideally, around 0.5 to 0.7 µm.

The manufacturing process of the present invention will now be described in detail with reference to a single pixel 2, although it will be understood that a plurality of pixels can be formed in an array, simultaneously, using this method.

FIG. 4 shows the steps for processing the IR wafer 8 to define the pixels 2 and build the supporting legs 7, as follows. First, an IR wafer 8 is provided (a), as described above. A thin film metal layer, such as AlSi or TiAl, is deposited (b) to act as a reflector layer 5, which is also used for ohmic contact. A trench 16, which effectively separates the pixel 2 into two halves, is then etched (c) through the reflector layer 5 and into the thermistor 3. Next, the area of the pixel 2 is defined by etching (d) through the reflector layer 5, the thermistor 3 and the BOX layer 14 of the SOI wafer. A thin layer of insulator material, for example $Al_2O_3$, is then deposited (e), preferably by atomic layer deposition (ALD), to form a first electrical insulation layer 17, insulating the vertical sidewalls of the trench 16 etched into the thermistor 3. Following this, a layer of low temperature oxide 18 is deposited (f) by, for example, plasma-enhanced chemical vapor deposition (PECVD), then planarized by polishing. Contact windows 19 for the legs 7 are opened by etching (g) through the first low temperature oxide layer 18 and the insulation layer 17 beneath it and a thin film material is deposited (h) and patterned to form legs 7 for the pixel. Further low temperature oxide is then deposited (i) on the surface, as before, and then planarized (j) by polishing.

As discussed above, the material for the legs 7 must be selected to provide sufficient mechanical strength to support the pixel 2, ensure a good electrical connection, whilst preventing heat conduction, between the pixel 2 and the ROIC on the ROIC wafer 9 via the legs 7. This material must also withstand the subsequent etching of the sacrificial oxide layers to release the pixels 2. An example of a suitable material for the legs 7 is amorphous TiAl.

FIG. 5 shows how processing of the IR wafer 8 continues with the formation of a first conductive portion 25, which is in physical contact with the legs 7, as follows. First, contact windows 22 to the legs 7 are opened (a) by etching through the sacrificial oxide layer 18 and then a thin metal layer 23, for example TiW/Cu, is deposited (b) on the surface of the IR wafer. This metal layer 23 serves as a seed and adhesive for the electroplating that follows, whereby a good conductor material 24, such as copper (Cu), is electroplated over the surface of the IR wafer 8. Following this, any of the conductor material 24 that is exposed above the surface of the sacrificial oxide layer 18 is removed (d) by polishing. Thus, the conductor material 24 remains only in the contact window 22, forming a first conductive portion 25 in contact with the underlying legs 7. At this point the IR wafer 8 is ready to be bonded to the ROIC wafer 9.

FIG. 6 shows the steps for preparing (a) the pre-fabricated ROIC wafer 9 for bonding. First, a thin insulator layer 26 of, for example, $Al_2O_3$ is deposited (b), preferably by atomic layer deposition (ALD), on the surface of the ROIC wafer 9. This insulator layer 26 will serve as an etch barrier against vapor HF used at a later stage to release the pixels 2. However, this insulator layer 26 needs to be removed from the metal ROIC pads 21 and hence it is patterned by lithography and etched. The etching should stop at the underlying metal ROIC pad 21, but selectivity is typically not critical at this step (commonly used ROIC pad materials are AlSi, AlCu or AlSiCu).

Following the above process steps, a low temperature oxide layer 27 is deposited (c) on the ROIC wafer 9 using, for example, plasma-enhanced chemical vapor deposition (PECVD), and then polished to planarize it. Similar to the formation of the first conductive portion on the IR wafer, a contact window 28 to the ROIC pads 21 is then opened (d) by etching through the oxide layer 27. A thin metal layer 29, similar to the metal layer 23 provided on the IR wafer 8, is then deposited (e) on the surface of the ROIC wafer 9. Following this, a good conductor material 30, such as copper (Cu), is electroplated (f) over the whole surface of the ROIC wafer 9 before any conductor material 30 that is exposed above the surface of the sacrificial oxide layer 27 is removed (g) by polishing. Thus, conductor material 30 remains only in the previously etched contact window 28, forming a second conductive portion 31 in contact with the underlying metal ROIC pads 21 of the ROIC wafer 9. At this point the ROIC wafer 9 is ready to be bonded to the IR wafer 8.

An alternative process is to first planarize the ROIC wafer 9 surface by depositing a low temperature oxide having a thickness greater than the topography of the wafer surface 13 using, for example, PECVD. This oxide layer is polished to planarize it before contact holes are etched through it, down to the ROIC metal pads 21. Following this, a metal layer can be deposited and patterned to create a second conductive portion 31 on top of the ROIC metal pads 21 and steps (b) to (g) of the above method are then followed. In this alternative process, the insulator layer 26 is deposited on a planarized surface instead of a surface with surface irregularities 13.

A further alternative process is to reorder the process to such that the patterning of the insulator layer in step (b) is instead combined with step (d), after (c), as a double etch process such that the pattern of the ALD layer can be done after the contact windows are opened.

Figure 7:
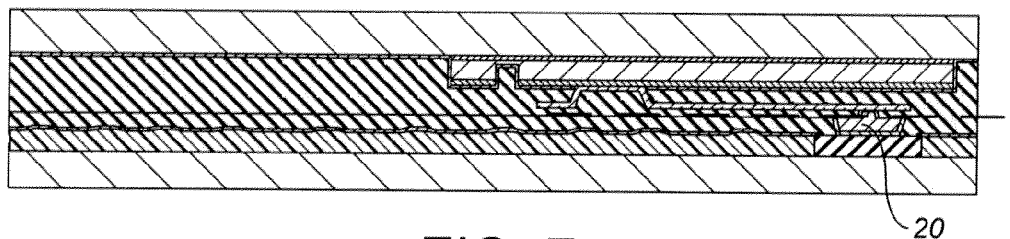
FIG. 7 is a sectional view of a pixel after the IR wafer has been bonded to the ROIC wafer.
Figure 8A:
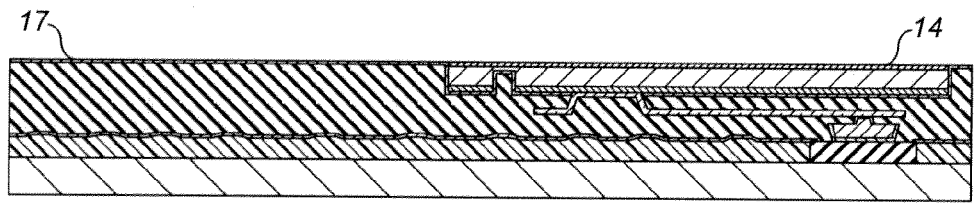
FIG. 8 shows the process steps for completion of the pixel structure following transfer of the thermistor material from the IR wafer to the ROIC wafer.
Figure 8B:
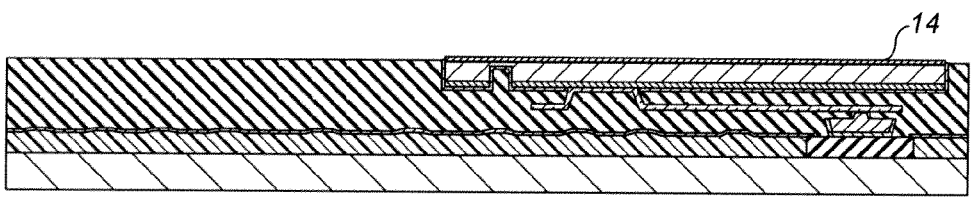
Figure 8C:
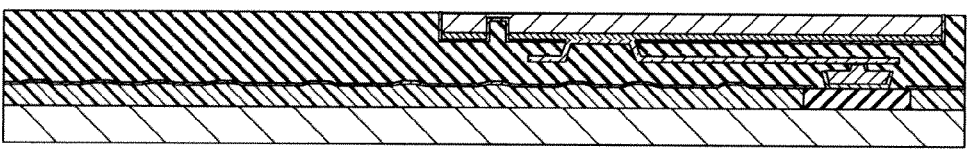
Figure 8D:
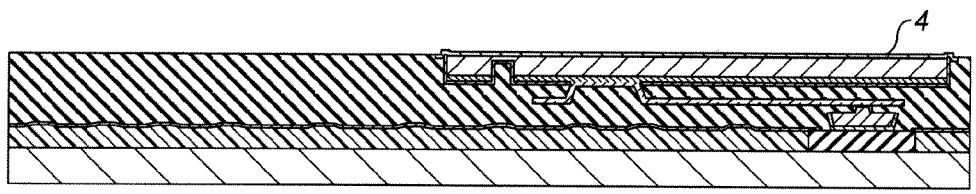
Figure 9A:
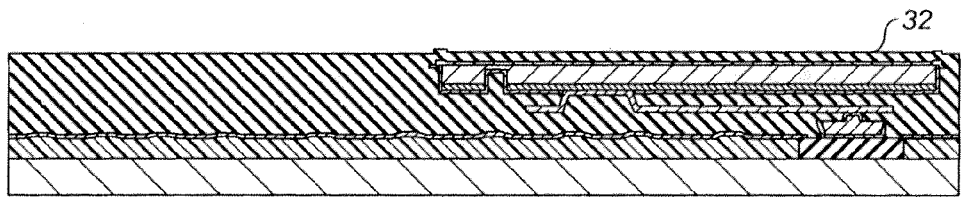
FIG. 9 shows the process steps for forming a bonding frame on the ROIC wafer.
Figure 9B:
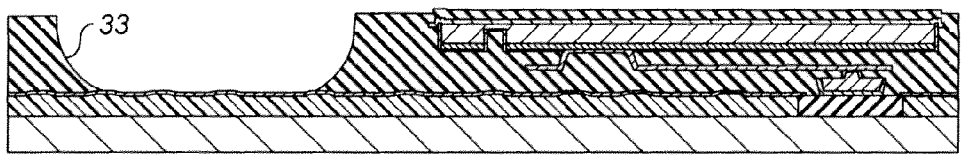
Figure 9C:
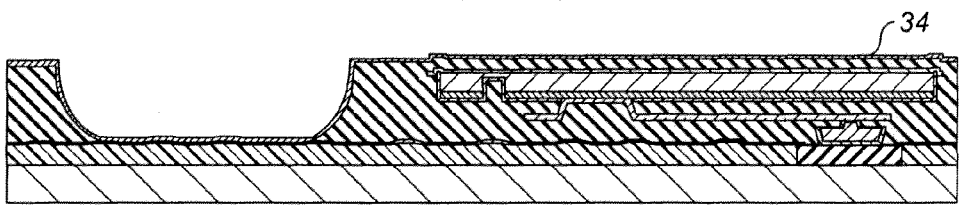
Figure 9D:
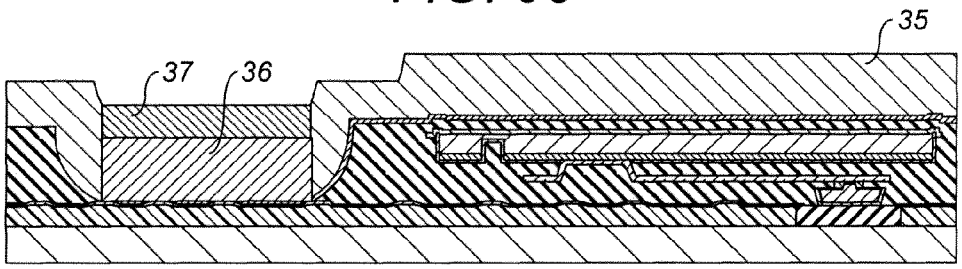
Figure 9E:
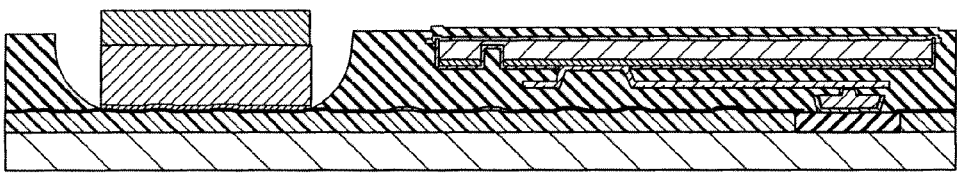
Figure 10:
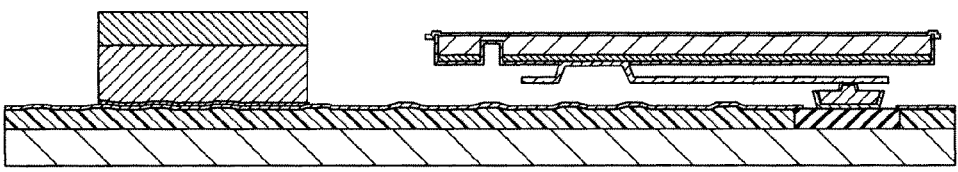
FIG. 10 is a sectional view of a released pixel ready for cap wafer sealing.
Figure 11A:
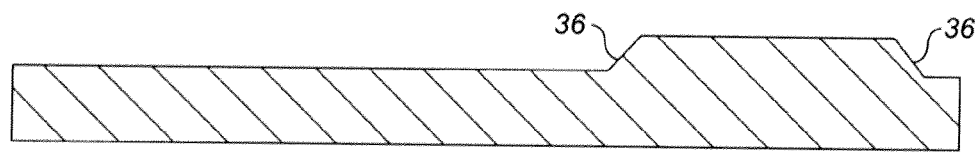
FIG. 11 shows the steps for forming the cap wafer for sealing the focal plane array.
Figure 11B:
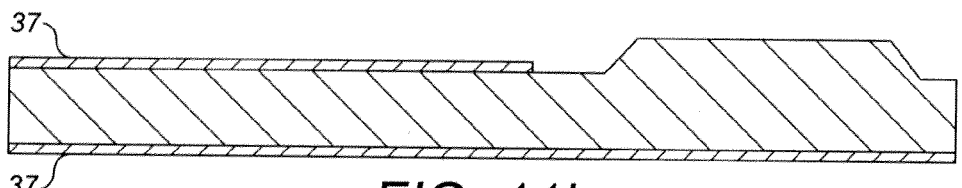
Figure 11C:
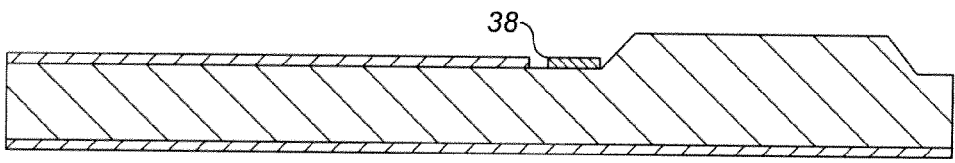
Figure 11D:
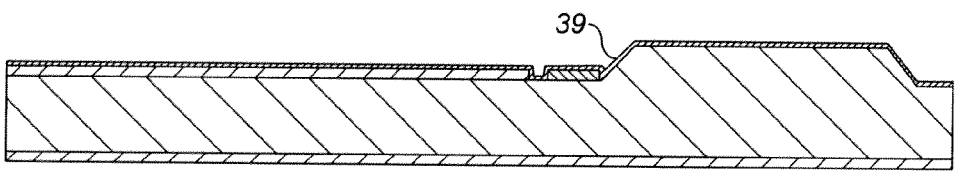
Figure 11E:
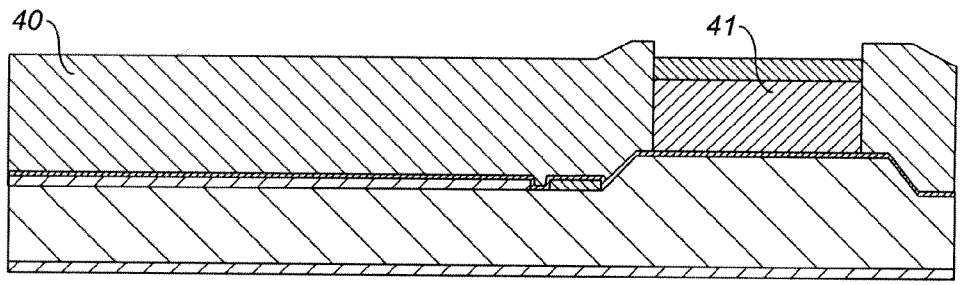
Figure 11F:
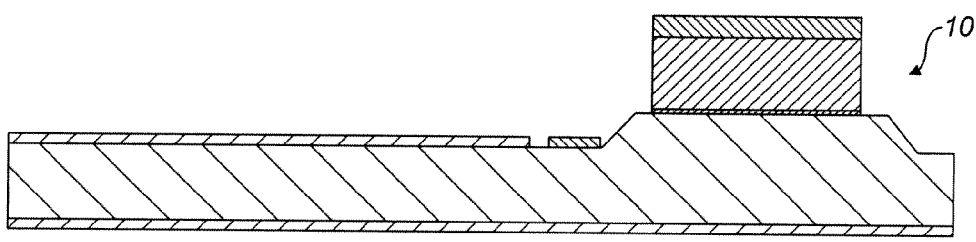

FIG. 7 shows the IR wafer 8 and the ROIC wafer 9 joined together by using a transfer bonding process, during which the two wafers 8, 9 are bonded together and the IR sensitive thermistor layer 3 and reflector layer 5 are transferred to the ROIC wafer 9. The bonding interface between the two wafers 8, 9 (shown by the broken line) consists of both $SiO_2$ and the conductive material 24, 30 of the first and second conductive portions 25, 31, which in this example is Cu. The wafer bonding can therefore be a combination of thermo-compression metal bonding, and oxide-oxide bonding performed at temperatures less than 400° C. However, as the oxide layers 18, 27 are later removed after the transfer bonding process during the release of the pixel 2, it is the metal bond between the resulting conductive contact plugs 20 formed in the bond interface that is essential for the pixel 2 to function.

Although not essential, it can still be advantageous to also bond the oxide layers 18, 27, at least partially, for the following reasons. Firstly, oxide-oxide bonds initiate at room temperature, keeping the wafers 8, 9 together while the temperature is ramped up for the thermo-compression bonding. This ensures that the alignment between the two wafers 8, 9 is kept at the same level as obtained at room temperature. Secondly, the area of the bonded metal 25, 31 in the resulting conductive contact plugs 20 is small and does not necessarily offer sufficient strength to withstand the shear forces developed during subsequent grinding to remove the sacrificial IR wafer 8.

An alternative process can be used for the formation of the conductive portions 25 and 31 and of the wafer bonding interface for the IR wafer and the ROIC respectively, which also falls within the scope of the present invention. In this alternative, the metal deposition and patterning of the metal portions 25 and 31 respectively are performed first. An oxide layer is then deposited and then polished to planarize it, such that any oxide material that is exposed above the surface of the metal portions is removed. The bonding interface consists in this case as well of both $SiO_2$ and the conductive material of the first and second conductive portions 25, 31.

FIG. 8 illustrates the steps that complete the preparation processing of the pixel 2 following the transfer bonding of the thermistor material, as follows. The sacrificial handle layer 15 of the original carrier wafer 12 that was used to create the IR wafer 8 is removed (a), preferably by grinding and/or etching followed by removal (b) of the insulation layer 17. The BOX oxide layer 14 of the original SOI wafer 12 is then removed (c). Finally, a thin film material is deposited (d), for example $MoSi_2$ or TiAl, to act as an absorber layer 4 in the 7-14 μm range of the electromagnetic spectrum. The absorber layer 4 is then patterned.

FIG. 9 illustrates a bonding frame 11 being formed on the ROIC wafer 9, the bonding frame 11 being arranged around the perimeter of a focal plane array 1 to prepare it for encapsulation by a cap wafer 10. The bonding frame 11 is formed as follows.

Firstly, a protective oxide layer 32 is deposited and patterned (a) such that it covers the area of the pixels 2 to protect them from the following deposition of a metal layer 34 (as will be explained below). Next, a contact window 33 is etched (b) into the oxide layer 32 down to the insulator layer 26 which was previously deposited on the ROIC wafer 9 during its preparation. A thin metal layer 34 is then deposited (c) on the surface of the ROIC wafer 9, similar to the metal layers 23, 29 that were deposited on the IR wafer 8 and ROIC wafer 9, respectively during their preparation.

Following this, a thick electroplating resist 35 is deposited and patterned before suitable materials 36, 37 to form the bonding frame, such as Cu and Sn, are electroplated (d) onto the surface of the ROIC wafer 9 within the contact window 33 to form the bonding frame 11. Finally, the electroplating resist 35 and the exposed metal layer 34 is removed (e), leaving the bonding frame 11 ready to receive the cap wafer 10.

The final step in defining the pixels 2 is the removal of the sacrificial oxide layers 18, 27 to release the pixels 2, as shown in FIG. 11. The sacrificial oxide layers 18, 27 are preferably removed using anhydrous vapor HF, which is compatible with all of the exposed materials. Following the release of the pixels 2, the FPA 1 is ready for cap bonding. Given the fact that at the moment of cap bonding the pixels 2 are already released, no wet chemical treatment of the wafers is allowed because of the fragility of the FPA 1.

FIG. 11 shows the steps of forming the cap wafer 10 for encapsulating the FPA 1 under vacuum to reduce heat transfer away from the pixels 2. The cap wafer 10 used for the hermetic vacuum encapsulation of the focal plane array 1 is required to transmit the incident IR waves. Both Si and Ge exhibit high optical transmittance in the wavelength range of interest and are therefore both suitable for this purpose. However, the thermal expansion coefficient of Ge is high compared to that of Si, which will result in high thermal residual stresses being induced in the bonded materials and thus Si is the preferred choice. Selecting the thickness of the cap wafer 10 is a trade off between the need to minimize the absorption, wherein the thinner the wafer the better, and the requirements of safe handling during processing. The cap wafer 10 can be formed as follows.

First, cavities 36 are etched (a) into the cap wafer, which is done for a number of reasons, such as: to accommodate the different thin films required by the functionality of the focal plane array, as described below; to cope with bowing of the cap wafer that results from the atmospheric pressure pressing from the top side of the cap; and to provide a sufficient distance above wire bonding pads that are provided outside the sealed cap (not shown) to allow subsequent sawing for the release of these pads.

An antireflective coating 37 is then deposited (b) on one or both sides of the cap wafer 10 to minimize the reflection of the IR radiation. In the example shown, the coating 37 has been deposited on both sides of the cap wafer 10. A long-wave pass (LWP) filter can also be provided on the surface of the cap wafer 10, preferably as part of the antireflective coating 37, to block short wavelengths and prevent the heating of the pixels 2 by direct exposure to sunlight. The LWP filter is, in principle, needed only on the outer top surface of the cap wafer 10.

However, such a difference in layers on the two sides of the cap wafer 10 can introduce considerable stress and therefore cause the cap wafer 10 to bow. If severe, this bowing will prevent the cap wafer 10 from bonding. Both the LWP filter and antireflective coating 37 are therefore, preferably, deposited on both surfaces of the cap wafer 10. On the underside of the cap wafer 10 the coating 37 and filter can be patterned so that it is removed from the areas to be bonded.

Next, an optional patterned thin film non-evaporable getter 38 is deposited (c), for example by means of shadow mask technology, to trap potential residual gases in the bonded cavities and thereby ensure the required vacuum level for the whole life time of the FPA. The getter 38 should not be placed above the active pixels 2 in case it is not transparent to IR radiation. Thus it is located above the blind reference pixels and ROIC electronics. Similar to the formation of the bonding frame 11 on the ROIC wafer 9, a thin metal layer 39, for example TiW/Cu, is deposited (d) on the unetched, raised portion of the cap wafer 10 to act as an adhesive and seed, before a thick electroplating photoresist 40 is deposited and patterned (e). Finally, the metal layer(s) that will form the bonding frame, in this example Cu and Sn, or just Cu, are electroplated (f) onto the surface of the cap wafer 10 to define the bonding frame 41 on the cap wafer, which is followed by the removal of the photoresist 40 and the thin metal layer 39.

As explained above, the cap wafer 10 encapsulates the focal plane array 1 by bonding the bonding frame 41 on the cap wafer 10 to the bonding frame 11 provided on the ROIC wafer 9, under vacuum to seal the pixels 2 within the focal plane array 1.

Although the manufacture of an individual focal plane array 1 is discussed in the example above, the method of the present invention is preferably used to manufacture a plurality of focal plane arrays on a single ROIC wafer 9, which are then encapsulated by a single cap wafer 10 at wafer-level, using a suitable sealing method such as Cu—Sn bonding (although other approaches such as Au—Sn bonding are equally applicable) before being diced into a plurality of individual focal plane arrays. The method of the invention therefore enables more efficient and reliable manufacture of devices through wafer-level encapsulation prior to dicing.

The invention claimed is:

1. A method of forming a focal plane array comprising one or more pixels, the focal plane array being fabricated by:
   forming a first wafer having sensing material provided on a surface, which is covered by a first sacrificial layer, the sensing material defining one or more pixels on the first wafer;
   providing support legs for each of the one or more pixels within the first sacrificial layer, covering them with a further sacrificial layer and forming first conductive portions for each of the one or more pixels in the surface of the further sacrificial layer that are in contact with the respective support legs;
   forming a second wafer having a read-out integrated circuit (ROIC), the second wafer being covered by a second sacrificial layer, into which is formed second conductive portions for each of the one or more pixels in contact with the ROIC;
   bringing the first, second and further sacrificial layers of the formed first wafer and second wafer together such that the first and second conductive portions for each of the one or more pixels are aligned;
   bonding the aligned first and second conductive portions together to form conductive contact plugs;
   removing a sacrificial handle layer of the first wafer and thereby transferring the sensing material from the first wafer to the second wafer; and
   removing the first, second and further sacrificial layers to release the at least one pixel,
   wherein each of the support legs is a single component in direct physical contact with both the pixel and the conductive contact plugs, to provide an electrical connection between the pixel and the ROIC and is arranged to be completely beneath the sensing material of the pixel they are provided for.

2. The method of claim 1, further comprising a step of providing a reflector layer between the surface of the first wafer and the sensing material provided on its surface.

3. The method of claim 2, further comprising a step of providing an absorber layer on the surface of the sensing material.

4. The method of claim 3, wherein the sensing material is infrared (IR) sensitive.

5. The method of claim 4, wherein the sensing material is a thermistor material and the pixel is a bolometer pixel.

6. The method of claim 5, further comprising a step of encapsulating the at least one pixel beneath a cap that is sealed over the focal plane array.

7. The method of claim 6, further comprising a step of forming at least one bonding member on the second wafer for the cap to be bonded to.

8. The method of claim 7, wherein a plurality of focal plane arrays are provided on the second wafer, each focal plane array being defined by a plurality of bonding members, wherein the plurality of focal plane arrays are sealed by a single cap wafer following which they are divided into individual focal plane arrays.

9. A thermal imaging device comprising a focal plane array manufactured by the method of claim 1.

10. The method of claim 1, further comprising a step of providing an absorber layer on the surface of the sensing material.

11. The method of claim 10, wherein the sensing material is infrared (IR) sensitive.

12. The method of claim 11, wherein the sensing material is a thermistor material and the pixel is a bolometer pixel.

13. The method of claim 12, further comprising a step of encapsulating the at least one pixel beneath a cap that is sealed over the focal plane array.

14. The method of claim 13, further comprising a step of forming at least one bonding member on the second wafer for the cap to be bonded to.

15. The method of claim 14, wherein a plurality of focal plane arrays are provided on the second wafer, each focal plane array being defined by a plurality of bonding members, wherein the plurality of focal plane arrays are sealed by a single cap wafer following which they can be divided into individual focal plane arrays.

16. The method of claim 1, wherein the sensing material is infrared (IR) sensitive.

17. The method of claim 1, further comprising a step of encapsulating the at least one pixel beneath a cap that is sealed over the focal plane array.

18. The method of claim 1, further comprising a step of bonding the further sacrificial layer with the second sacrificial layer after said step of bringing the first, second and further sacrificial layers of the formed first wafer and second wafer together.

19. The method of claim 18, wherein said step of bonding the further sacrificial layer with the second sacrificial layer comprises oxide-oxide bonding performed at temperatures less than 400° C.

20. The method of claim 19, wherein said further sacrificial layer and said second sacrificial layer each comprises $SiO_2$.

* * * * *